United States Patent [19]

Durkee

[11] 4,144,139

[45] Mar. 13, 1979

[54] METHOD OF PLATING BY MEANS OF LIGHT

[75] Inventor: Lawrence F. Durkee, Lovell, Me.

[73] Assignee: Solarex Corporation, Rockville, Md.

[21] Appl. No.: 843,841

[22] Filed: Nov. 30, 1977

[51] Int. Cl.² .................. C25D 5/02; H01L 31/06
[52] U.S. Cl. ........................ 204/15; 204/DIG. 3; 204/38 B; 136/89 CC
[58] Field of Search ............... 204/15, 38 B, DIG. 3; 136/89 CC

[56] References Cited

U.S. PATENT DOCUMENTS

| | | | |
|---|---|---|---|
| 3,013,955 | 12/1961 | Roberts | 204/15 |
| 4,024,029 | 5/1977 | Rain et al. | 204/15 |
| 4,038,104 | 7/1977 | Tsutomo | 136/89 P |

Primary Examiner—J. H. Mack
Assistant Examiner—Aaron Weisstuch
Attorney, Agent, or Firm—Watson, Cole, Grindle & Watson

[57] ABSTRACT

Plating electrical contacts onto one or more surfaces of a solar cell having an electrical junction therein is accomplished by immersing the cell in an electrolyte and exposing it to light so that platable ions in the electrolyte will be attracted to an oppositely charged surface of the cell.

9 Claims, 3 Drawing Figures

METHOD OF PLATING BY MEANS OF LIGHT

The present invention relates generally to light-sensitive devices employing the photovoltaic effect. Prominent among such articles of manufacture are solar energy cells in which at least one photovoltaic junction has been provided. When the cell is exposed to light, the photovoltaic junction is activated and positively and negatively charged species will migrate from the junction to opposed surfaces of the cells, thereby creating a flow of electricity when a circuit is formed between the front and back surfaces of the cell. In order to permit a flow between the positive and negative charges formed at the opposed surfaces of the cell, contacts are provided, such contacts being formed from a metal, for example, silver, that is a good conductor of electricity. More specifically, my invention relates to a method of forming such contacts, which method makes use of the inherent proerties of the photovoltaic device, itself.

In order to create a circuit that extends from one surface to the device displaying the photovoltaic effect, which will hereinafter be exemplarily designated as a solar cell, to the other surface of the cell, the surfaces being oppositely charged so that a flow of electrons is provided to accomplish work, it is well-known in the art that there must be contacts on both the front and back surfaces of the cell. Those contacts accomplish the function of collecting charges that have migrated to the respective surfaces and then transmitting the charges to wire or other conventional transmission means. In collecting and transmitting, however, that surface of the cell — usually designated as the front surface — that will be positioned for the impingement of light thereon, cannot be so impeded by the presence of the contacts that an undue portion of the light that would otherwise come into contact with that surface surfaced will be prevented from being absorbed by the surface and contacting the electrical junction beneath the surface. On the other hand, the back surface of the cell, which is normally not exposed to light, may be covered with a continuous layer of contact material. Consequently, a photovoltaic cell in common use will have a grid or network of conductive metal on its front surface so that a substantial portion of that surface may nevertheless admit and absorb light impinging thereon. In contrast, there is a continuous layer of contact metal on the back surface of the cell.

Since the back surface of the cell generally will have a contact metal, e.g., silver, plated over its entire surface, the provision of a contact layer of silver on the back surface of a photovoltaic cell has not given rise to problems of great difficulty. A standard electroplating method has been used to provide a layer of silver of, for example, ten microns in thickness on the entirety of the back surface of the cell. With respect to the front surface, however, a grid of contact metal must be formed and this has given rise to several problems. In an n-p cell the front surface of which is to be exposed to light, the light will generate negative charges that migrate to the front surface of the cell. The negative charges are then conducted by a silver grid and directed to bussbars or other suitable means for directing the electrons away from the cell.

When silver, and to a lesser extent because of its greater price, gold, have been preferred as contact-forming metals for solar cells and other semiconductor devices, other metals such as nickel, copper, or even solder are also suitable for use as contacts. However, silver, at least at the present time, is preferred, although it is relatively expensive compared, e.g., to solder. Therefore, since silver is to be applied in a particular pattern, it is far less expensive to apply it in that pattern, rather, for example, by a process such as vapor deposition, in which a layer of silver is applied indiscriminately on all portions of an apparatus and a shadowmask is used to prevent the silver from being deposited on those portions of the front surface of the cell where deposition is not desired.

It has been found advantageous, therefore, to employ a method of making a contact by depositing metallic silver on a body composed of one or a combination of metals, which will be hereinafter denoted as a contact base. The contact base adheres well to silicon and to silver and serves as an intermediary between them. After the contact base upon which the silver is to be deposited has been formed, e.g., in a network, silver is deposited on the contact base from an electroplating bath in a known manner. When electric current is activated, silver is plated from the potassium silver cyanide solution and a silver anode onto the grid, which is a continuous pattern of electrically conductive material and serves as a cathode.

Electroplating the surface of a silicon wafer with silver from a standard electroplating bath has presented problems that, rather than constituting insuperable obstacles, may be described simply as difficult. Thus, in order to close an electrical circuit from a source of electrical energy to a silver electrode, through the bath of electrolyte, to the front surface contact base grid, and then back to the source of electricity, it is required that the cells be mounted within the bath of electrolyte in such manner that the circuit from the contact base grid will be closed, i.e., that there will be an electrical connection between the contact grid on the front surface and the source of electrical energy. In order to close the circuit, solar cells have generally been held in position in the electrolyte by means of clamps, each cell requiring its own clamp. Then, since the clamp is formed from a conductor of electricity, the circuit is closed by running a wire from the clamp to the source of electricity. Such a method of electroplating, while perfectly feasible, does present certain inconveniences in having to individually mount each cell in its clamp, making certain that the cell is firmly held by the clamp, and ensuring that the clamps do not introduce any impurities into the electrolyte bath. Since the clamps will act as conductors of electricity, they must contact portions of the network of contact base on the front surface of the cell so that all portions of the network will be part of the circuit and, therefore, will be subject to silver deposition.

A special problem arises in plating small cells such as those adapted to be utilized to power electronic watches or to be used as diodes or sensors. Because it is difficult to handle small cells, it has been found desirable to utilize a relatively large silicon wafer that may be handled easily during electroplating, and thereafter to cut or subdivide the wafer into individual chips after the wafer has been converted into solar cells. In this manner, a relatively large cell that can be handled without undue difficulty can be formed. Then, individual relatively small chips will be cut from the large wafer or cell matrix. Indeed, where the cells are tiny, it is almost impossible to handle them individually in the manner of large cells, because, e.g., clamping of the cells is extremely time consuming and undesirable.

Where a large matrix of solar cells is to be subdivided into individual chips, however, it will be apparent that the matrix has a front surface composed of individual contacts spaced from each other along the entirety of the matrix surface, rather than one continuous grid at the surface. This structure is the result of forming a continuous junction and then etching out adjacent portions to form individual surface segments with individual junctions separated from each other, but joined to present a relatively large, easily handable cell matrix. Since there will be no continuous grid pattern formed on the front surface of the cell matrix, normal clamping methods would have to establish electrical contact with each contact base on the front surface of the cell matrix. However, it is extremely difficult to establish an electrical connection between the individual, isolated contact bases on the front surface of the cell matrix and the clamp for the cell matrix, thereby to close the circuit. Yet if the circuit is not closed with respect to each contact base, there will be no electroplating out of silver on any base that is not part of the circuit. Consequently, attempts to use a normal clamping and electroplating method that has previously and satisfactorily been used when there is a continuous junction and a continuous grid pattern along the front surface of a solar cell have failed when the junction and overlying contact grid of base metal are discontinuous along the surface.

It is, therefore, a primary object of the present invention to provide a method for electroplating a contact metal onto a solar energy cell or other photovoltaic device in which conventional, cumbersome electroplating apparatus and the attendant labor involved in such electroplaing may be eliminated.

It is another object of the present invention to provide a method for electroplating a contact metal onto the surface of a solar cell in which such electroplating will be accomplished regardless of the lack of continuity of the metallic contact bases to which the contact metal is to be adhered.

These and other objects, are accomplished in a manner that is simple yet, to the best of my knowledge, has not perviously been utilized. The present method makes specific use of the fact that the material being plated is a solar cell, i.e., a body of semi-conductor material that will generate positively and negatively charged particles when exposed to light. That light is utilized to create an electrical field without the need for the electrical energy originating from an outside source that is conventional in electroplating, and thereby avoids the use of clamps or other apparatus previously used not only to hold cells in positon in an electroplating bath, but to close the circuit to or from an outside source of electrical energy.

Moreover, it has been found that when the solar cell, itself, is used as a source of electrical energy, continuity of the grid pattern on the surface of the cell is not a requisite for closing the circuit through clamps or other holding means. Since it is the solar cell that creates a flow of electrical energy upon exposure to light, each junction portion on the surface of the cell is activated by light and becomes a potential part of the electrical circuit created by exposure to light. As a consequence, plating with a metal such as silver can take place in any pattern desired, regardless of whether the pattern is continuous or discontinuous, without the need of connecting each contact base portion at the surface of the wafer in a circuit including an external source of electrical energy.

In its broadest form, the present invention contemplates a method of plating an electrical contact on a solar cell that comprises a wafer having a photovoltaic junction formed therein. When the wafer and its photovoltaic junction are exposed to light, positive charges will collect at one of the major surfaces of the wafer and negative charges at the other of the major surfaces, which are generally the front and back surfaces of the cell. Which surface will have the positive and which surface will have the negative charges is determined by whether the cell is a p-n or an n-p cell, although the term p-n cell has been used generically to encompass both types of cells. The wafer is positioned in a bath of electrolyte containing platable, positively charged ions, then exposed to light. Such exposure results in the positively and negatively charged particles collecting at the two major surfaces, where the positively charged ions in the electrolyte will be attracted to the surface on which the negative charges have collected and will plate out on all or selected portions of that surface.

As stated previously, another form of the invention is one in which it is desired to plate positively charged metal ions on a major surface of a wafer that will subsequently be subdivided into individual solar cells, which surface has an underlying, discontinuous injunction. In such instance, when the cell is exposed to light, the negative charges that collect at the surface where the discontinuous junction has been formed will be concentrated at the contact base portions of the surface. So, when the positively charged ions plate out on that surface, they will do so on the contact bases and not, for example, on the junction discontinuities.

A further feature of the present invention is providing for renewal of the metal ions in the electrolyte by coating one surface of the cell, generally the back surface, with metal over substantially the entirety of that surface. Then, when the front surface of the cell is exposed to light, there will be a migration of metal ions from the coating of the back surface of the cell to the front surface, thereby completely or, in a preferred form, selectively coating the front surface with a contact metal without the necessity of using a separate anode, e.g., a silver bar.

The above summary of the invention presents that method in a scope that does not take into account certain other features of the invention. Thus, additionally, it has been found preferred that the positively charged ions be silver ions. Silver ions in the electrolyte are readily available in a conventional electroplating fluid, e.g., an aqueous solution of a silver salt. Correspondingly, when it is desired to utilize the coating on the back surface of a silicon wafer to provide or replenish the silver ions that are to be used to selectively coat and form contacts on the front surface, the back surface of the wafer will be plated with silver, generally by conventional plating methods. Still more specifically, the light utilized to activate the silicon wafer may be incandescent light or sunlight or fluorescent light.

These and other features and advantages of the present invention will be more apparent when considered in connection with a preferred embodiment of my invention that is presently contemplated as the best mode of performing the present method. Certain structural portions of the apparatus and product utilized in the performance of that method are illustrated in the accompanying drawings, in which.

Figure 1:
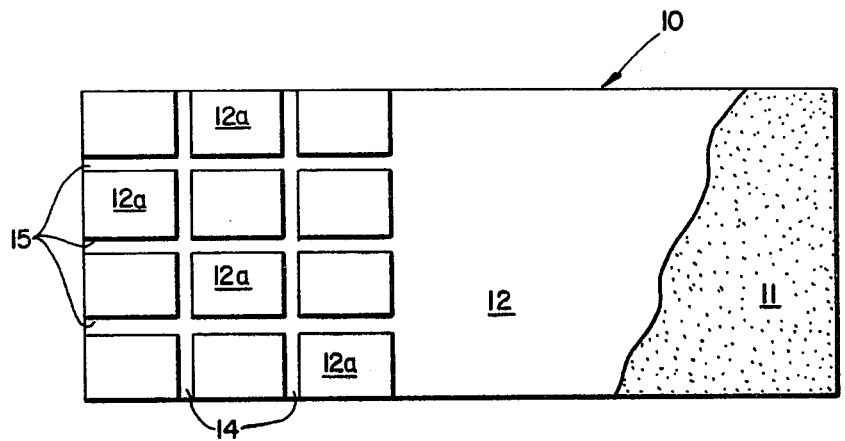
FIG. 1 is a top plan view, partly cut away, of a cell matrix formed with discontinuous junctions and adapted to be subdivided into individual solar cells.
Figure 2:
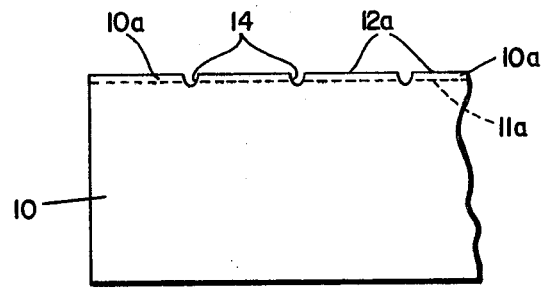
FIG. 2 is an elevational view of the matrix of FIG. 1.

Referring now to the drawing, and more specifically to FIGS. 1 and 2 thereof, a matrix of silicon 10, which may also be referred to as a silicon wafer, is formed with a photovoltaic junction zone 11 inwardly of the front, light-impinging surface of the wafer. Such front surface is generally indicated by reference numeral 12 in FIG. 1. The photovoltaic junction zone 11 extends in a region across the entire face of the wafer 10 substantially parallel to the front surface 12 of the wafer, and in the embodiment described, is an n-p junction. As is presently preferred, the wafer itself is formed from monocrystalline silicon that has been doped with boron. Subsequent to such doping, another impurity, in this instance, phosphorus, is diffused into the wafer by known means and thereby forms a phosphorus-boron junction 11, in which the monocrystalline silicon acts as a host for the impurities that are of different conductivity types. The junction zone is also shown in FIG. 2, and is positioned perhaps 1,000Å units below the front surface 12 of the wafer.

In the preferred embodiment of my method according to the present invention, subsequent to the formation of the n-p junction 11, it is desired to divide the silicon matrix 10 into a series of individual wafer parts, which may find use as solar cells for electronic watches or for such other uses that will require solar cells of the size that would be extremely difficult to handle individually. Consequently, for the purposes of illustration, the wafer 10 is to be divided into a plurality of individual wafer sections. As shown, there are to be four solar cells formed across the width of the wafer. Consequently, in FIG. 1, grooves are cut into the wafer across the width of the cell, such grooves being identified by numeral 14. In addition, since each width of the cell is to be subdivided to form four solar cells per width, three grooves 15 are cut into the cell by grinding or sawing. These grooves 15 extend along the length of the cell and, in my preferred embodiment, are equidistant to form four cells of equal width extending transversely of the wafer 10.

As will be more apparent from FIG. 2 of the drawings, the grooves 14 extend below the photovoltaic junction 11 that has been formed in the wafer 10; as a consequence, the wafer 10 at its front surface 12 has been divided into a series of individual wafer segments 10a, each with a junction segment 11a underlying its upper surface 12a. It is to these segments 10a that an individual contact is now to be applied so that, when the grooves 14 and 15 are subsequently cut through to form individual solar cells from the wafer segments, each cell will be able to function as an individual photovoltaic unit, yet without the disability of having had to be formed as an individual unit.

A metallic base is now to be applied to the silicon wafer front surface segments 12a, although the method by which such a base to which silver is to be adhered does not form part of my invention. That base, which may preferably be titanium-palladium, but also can be titanium-silver or chromium silver, is applied, e.g., by vapor deposition through a shadow-mask. In such vapor deposition procedure, a vacuum system marketed by Veeco Instruments, Inc. of Plainview, New York, is preferably utilized. Such system is identified by the designation VE 7760, which has two sets of tungsten filaments that vaporize metals contained therein.

Figure 3:
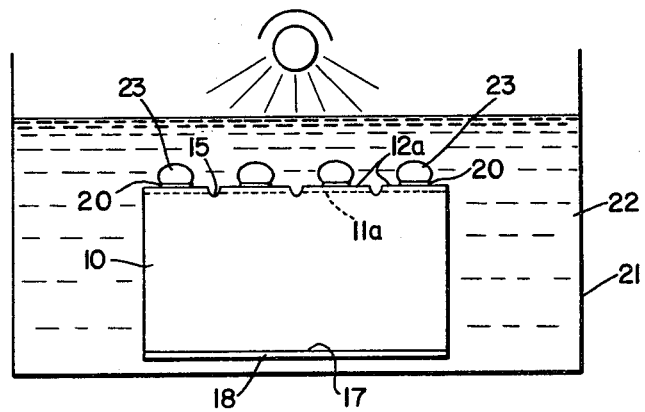
FIG. 3 is an elevational view of the wafer of FIG. 2 under exposure to light and having a contact formed on its front surface.

A contact base is indicated by reference numeral 20 in FIG. 3 of the drawing, where relative dimensions have been greatly exaggerated. That base lies atop a portion of the front face segment 12a of wafer segment 10a. It will normally cover only a fairly small portion of the area of the front face segment 12a, because the contact will obscure a portion of the front face and thereby diminish the amount of light that passes through the silicon and reaches the electrical junction 11a of each wafer segment 10a.

As so formed, the entire wafer matrix 10 is immersed in a container 21 containing a bath of electrolyte 22, as illustrated in FIG. 3. Such bath that has been used has been a potassium silver cyanide formulation sold by Sel-Rex Co., of Nutley, New Jersey, under the trademark Silver SOL-U-SALT. The material is stated to contain 54% silver. The entire wafer matrix 10 was immersed in this bath of electrolyte. First, however, the back surface 17 of the matrix 10, which had not been scored or grooved, was coated with a continuous layer of silver by known plating or electroplating methods, so that the entirety of that back surface 17 bore a silver coating 18 to a depth of about 10 microns.

In the form described, the wafer matrix 10 is an electrolytic bath 22 in container 21 was not passed under a 100-watt incandescent lamp. After five minutes the wafer matrix had been converted substantially to the form shown in FIG. 3, i.e., the thickness of the layer of silver 18 on the back surface 17 of the matrix had been reduced in thickness by approximately one-half, i.e., to 5 microns, and a glob of silver 23 had been deposited on each contact base 20. The silver adhered to the base and formed a unitary contact consisting of, e.g., titanium-palladium and silver firmly adhered to the front surface 12a of each solar cell segment 10a. Then the matrix 10 was cut through grooves 14 and 15 already formed therein to separate each wafer segment 10a from the remainder of the wafer segments. The result was a plurality of small solar cells, each containing a contact properly positioned and containing a mass of silver sufficient to make the contact a good conductor of electricity.

Apparently what occurred when the matrix 10 was exposed to light in the bath of electrolyte, was that light was absorbed by the front faces 12a of the individual wafer segments 10a and into contact with the junction segments 11a. Since the junction was an n-p junction, negative charges and holes or positive charges were generated, with the negative charges collecting at the front surfaces 12a of the matrix segments 10a, while positive charges collected at the back surface 17. Since the contact bases 20 were the most conductive portions of the front surfaces, the negative charges tended to congregate at such bases. A migration of silver ions then occurred from the electrolyte to the contact bases 20, with the silver ions in the electrolyte immediately thereafter being replaced by silver from the layer 18 that had been plated on the back surface 17 of the wafer matrix 10. This process continued so long as the front surface 12 of the matrix was exposed to light, in this case, incandescent light. The bath was then removed from beneath the light source, whereupon the matrix ceased to be activated and silver plating ceased. Thereafter the cell matrix was washed, subdivided and a highly corrosion resistant contact had been formed on each wafer segment 10a. As explained, the use of the solar cell to generate its own electricity in lieu of the conventional outside source of energy utilized in electoplating made possible a simple and convenient method for placing a contact on a solar cell. It is particularly convenient here where the contact area is so located that it is not readily subject to electroplating because it is extremely difficult, if not impossible, to connect each contact base 20 with an electrical lead.

It will be apparent to those of skill in this art that many obvious alterations, modifications and substitutions may be made in the preferred method of the present invention described hereinbefore, such embodiment of the invention having been delineated for exemplary purposes only. Thus, the pattern of the grid or contact on the front surface of the solar cell may be in any form desired and may be applied, at least initially, by photolithographic methods. In addition, rather than applying a coating 18 of silver on the back surface of the wafer matrix 10, that wafer matrix may simply be placed with its back surface 17 resting on bars of silver, which bars serve to replenish the silver ions in the electrolyte that are deposited on the contact bases. Consequently, as to all such obvious modifications, alterations, and substitutions, it is intended that they be deemed to be included within the purview of the present invention, which is to be limited only by the scope, including equivalents, of the following, appended claims.

I claim:

1. A method of plating an electrical contact on a light-sensitive device displaying the photovoltaic effect, comprising providing a semiconductive wafer having at least two major surfaces, said wafer having a photovoltaic junction formed therein so that when one of said major surfaces of said wafer is exposed to light, negative charges will collect at a first of said major surfaces and positive charges will collect at a second of said major surfaces, providing a coating of a platable metal on said second major surface, positioning said wafer in a bath of an electrolyte containing positively charged ions of said platable metal, and exposing said wafer to light to create a migration of said metal from said coating into said electrolyte and thence to said negatively charged first major surface.

2. A method as claimed in claim 1, in which said electrolyte comprises a water-soluble silver salt and said coating on said second major surface is silver.

3. A method as claimed in claim 1, in which said first major surface is the front, light-receiving and absorbing surface of said wafer and said second major surface is the back surface thereof.

4. A method as claimed in claim 3, including the further step of continuing to expose said front surface to light until a portion but not all of said back surface coating has been transferred to said front surface to create a solar cell having a platable metal on portions of said front and said back surfaces thereof.

5. A method as claimed in claim 1, in which said first major surface is provided with a plurality of contact bases to receive deposition of said positively charged ions.

6. A method of selectively plating an electrical contact on a light-sensitive device displaying the photovoltaic effect, comprising providing a silicon wafer with at least two major surfaces, a first of said major surfaces being formed of a plurality of discontinuous surface segments, each of said segments having a photovoltaic junction underlying it and separate from adjacent segment junctions so that when said wafer is exposed to light, negative charges will collect at said first major surface segments and positive charges will collect at a said second major surface, positioning said wafer in a bath of electrolyte containing platable positively charged ions, and exposing said wafer to light so that said platable positively charged ions will be attracted to said negatively charged segments of said first major surface to plate said surface segments but not the discontinuities between said segments.

7. A method as claimed in claim 6, in which said positively charged ions are silver ions.

8. A method as claimed in claim 6, in which the light to which said wafer is exposed is incandescent light.

9. A method as claimed in claim 6, in which said positively charged ions are metal ions and a source of metal ions is positioned in said electrolyte in electrical contact with said second major surface.

* * * * *